United States Patent
Campbell (10) Patent No.: US 6,989,691 B2
(45) Date of Patent: Jan. 24, 2006

(54) DYNAMIC TO STATIC CONVERTER WITH NOISE SUPPRESSION

(75) Inventor: Brian J. Campbell, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/748,639

(22) Filed: Dec. 30, 2003

(65) Prior Publication Data
US 2004/0155674 A1 Aug. 12, 2004

Related U.S. Application Data

(63) Continuation of application No. 10/122,524, filed on Apr. 15, 2002, now Pat. No. 6,717,442.

(51) Int. Cl.
*H03K 19/096* (2006.01)

(52) U.S. Cl. ............... 326/95; 326/93; 326/98

(58) Field of Classification Search ............ 326/93–98
See application file for complete search history.

(56) References Cited

U.S. PATENT DOCUMENTS

| 5,841,304 | A | | 11/1998 | Tam |
| 5,892,372 | A | | 4/1999 | Ciraula et al. |
| 5,917,355 | A | * | 6/1999 | Klass ..................... 327/208 |
| 6,531,897 | B1 | * | 3/2003 | Milshtein et al. ........ 326/95 |
| 2003/0062925 | A1 | | 4/2003 | Nedovic et al. |

* cited by examiner

*Primary Examiner*—Anh Q. Tran
(74) *Attorney, Agent, or Firm*—Garlick Harrison & Markison LLP (57) ABSTRACT

An apparatus is disclosed which includes a converter circuit and a noise suppression circuit. The converter circuit has a dynamic logic input, and is configured to generate a static logic output on an output node responsive to the dynamic logic input. The noise suppression circuit is coupled to receive a clock signal and is coupled to the output node. Responsive to a first phase of the clock signal, a precharge of a dynamic logic circuit generating the dynamic logic input occurs. The noise suppression circuit is configured to actively drive the static logic output on the output node responsive to the first phase. In some embodiments, the noise suppression circuit may reduce the noise sensitivity of the static logic output during the precharge phase, and may not impede operation of the converter circuit during the evaluate phase.

13 Claims, 9 Drawing Sheets

Computer Accessible Medium
300

Dynamic to Static
Converter Circuit
34

Fig. 9

DYNAMIC TO STATIC CONVERTER WITH NOISE SUPPRESSION

This application is a continuation of and claims priority to U.S. patent application having an application Ser. No. 10/122,524, filed Apr. 15, 2002, now U.S. Pat. No. 6,717,442 which application is hereby incorporated by reference.

BACKGROUND OF THE INVENTION

1. Field of the Invention

This invention is related to the field of dynamic and static logic circuits, and more particularly to noise issues in dynamic to static conversion.

2. Description of the Related Art

Dynamic logic circuits are a circuit design tool often used in integrated circuits. Generally, dynamic logic circuits are precharged to a first state and then conditionally discharged to a second state according to one or more inputs. In contrast, static logic circuits continuously respond to inputs by driving the outputs to high or low states according to the state of the inputs. Since the inputs of dynamic logic circuits are only connected to the discharge transistors (as opposed to static logic circuitry in which a given input is typically connected to at least two transistors, one which may charge the output and one which may discharge the output), the capacitive load on the inputs may be comparatively lower than equivalent static logic circuitry. Additionally, the use of only discharge transistors may inherently speed the evaluation of the logic circuitry. Thus, dynamic logic circuitry may typically evaluate more rapidly than the corresponding static logic circuitry.

One complication introduced with the use of dynamic logic circuits is the need to convert the dynamic logic signals produced by the dynamic logic circuits to static logic signals when the dynamic logic signals are input to static circuitry, dynamic circuitry operating on a different phase of the clock, etc. In particular, the conversion hides the precharge of the dynamic circuitry during the precharge phase from the static circuitry, providing a steady value during the precharge phase equal to the result of the evaluate phase. In this fashion, the static logic circuitry does not reevaluate based on the precharge values.

Figure 1:
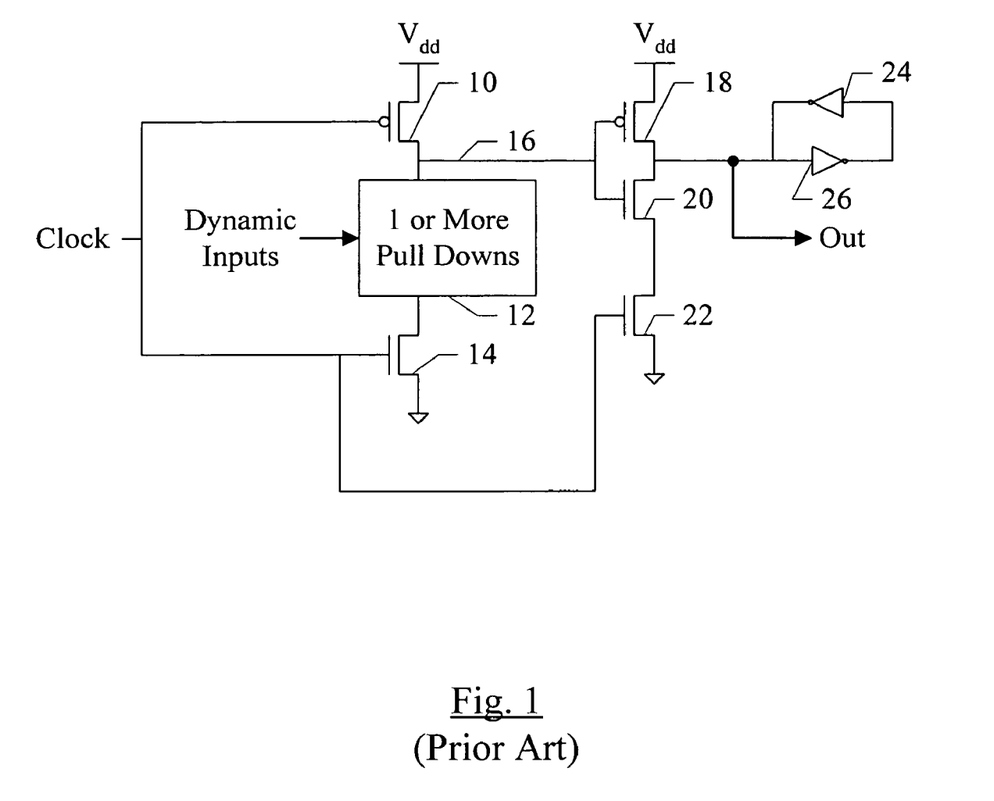
FIG. 1 is a circuit diagram of a prior art dynamic circuit with dynamic to static conversion.

Typically, the circuit shown in FIG. 1 may be used to convert dynamic logic signals to static logic signals. The circuit includes a dynamic logic circuit comprising a precharge transistor 10, one or more pulldown transistors 12 (shown in block form), and an evaluate transistor 14. The precharge transistor 10 is activated by the clock signal coupled to its gate node and precharges the node 16 during the precharge phase (clock low in this example). The dynamic inputs of the dynamic logic circuit are coupled to the pulldown transistors 12, which conditionally discharge the node 16 during the evaluate phase (clock high in this example). The evaluate phase is controlled by the evaluate transistor 14, which has its gate node coupled to the clock signal as well.

The node 16 is connected to the gate node of the transistors 18 and 20, which are coupled to the output node of the circuit. During the evaluate phase (when the transistor 22 is active), the transistors 18 and 20 function as an inverter, inverting the value on the node 16 to provide the output. During the precharge phase (clock low), the transistor 22 is deactivated. The precharge of the node 16 activates the transistor 20 and deactivates the transistor 18. Since both the transistor 18 and the transistor 22 are deactivated, the precharge does not pass to the output node. Thus, the output node remains at the value generated during the evaluate phase of the dynamic logic circuit.

To prevent the output node from floating during the precharge phase, the cross coupled inverters 24 and 26 are provided to latch the output value. So as not to impact the transition speed of the output node in response to the dynamic circuit operation during the evaluate phase, the inverter 24 is made relatively weak as compared to the other transistors in the circuit. Since the inverter 24 is the only circuitry supplying the value on the output node during the precharge phase and the inverter 24 is weak, the circuit shown in FIG. 1 is noise sensitive. That is, noise injected on the output node (typically the capacitive "crosstalk" from other wires near the wires connected to the output node) may have the tendency to flip the state of the output node, thus causing erroneous operation.

Typically, circuit designers attempt to limit the noise injected on the output node by limiting the distance that the wires attached to the output node travel (thus limiting the injection of noise by limiting the number and length of nearby wires) or by shielding the wires. Limiting the routing distance complicates the design and limits the use of the circuit shown in FIG. 1. Adding shielding increases the impact of the circuit shown in FIG. 1 on the wireability of the integrated circuit and may create additional layout complexities for the integrated circuit.

SUMMARY OF THE INVENTION

An apparatus is disclosed which includes a converter circuit and a noise suppression circuit. The converter circuit has a dynamic logic input, and is configured to generate a static logic output on an output node responsive to the dynamic logic input. The noise suppression circuit is coupled to receive a clock signal and is coupled to the output node. Responsive to a first phase of the clock signal, a precharge of a dynamic logic circuit generating the dynamic logic input occurs. The noise suppression circuit is configured to actively drive the static logic output on the output node responsive to the first phase. In some embodiments, the noise suppression circuit may reduce the noise sensitivity of the static logic output during the precharge phase, and may not impede operation of the converter circuit during the evaluate phase.

The noise suppression circuit, in one embodiment, includes at least a first transistor and a second transistor. The first transistor has a first node, a second node, and a first control node. The first node is coupled to a power supply and the first control node is coupled to receive a feedback signal corresponding to the static logic output. The second transistor has a third node connected to the second node, a fourth node connected to the output node, and a second control node controlled by the clock signal. The second transistor activates during the first phase responsive to the clock signal.

A method is also contemplated. A static logic output is generated on a node responsive to a dynamic logic input. The static logic output is actively driven on the node responsive to a first phase of a clock signal, wherein a precharge of a dynamic logic circuit generating the dynamic logic input occurs responsive to a first phase of the clock signal.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 2:
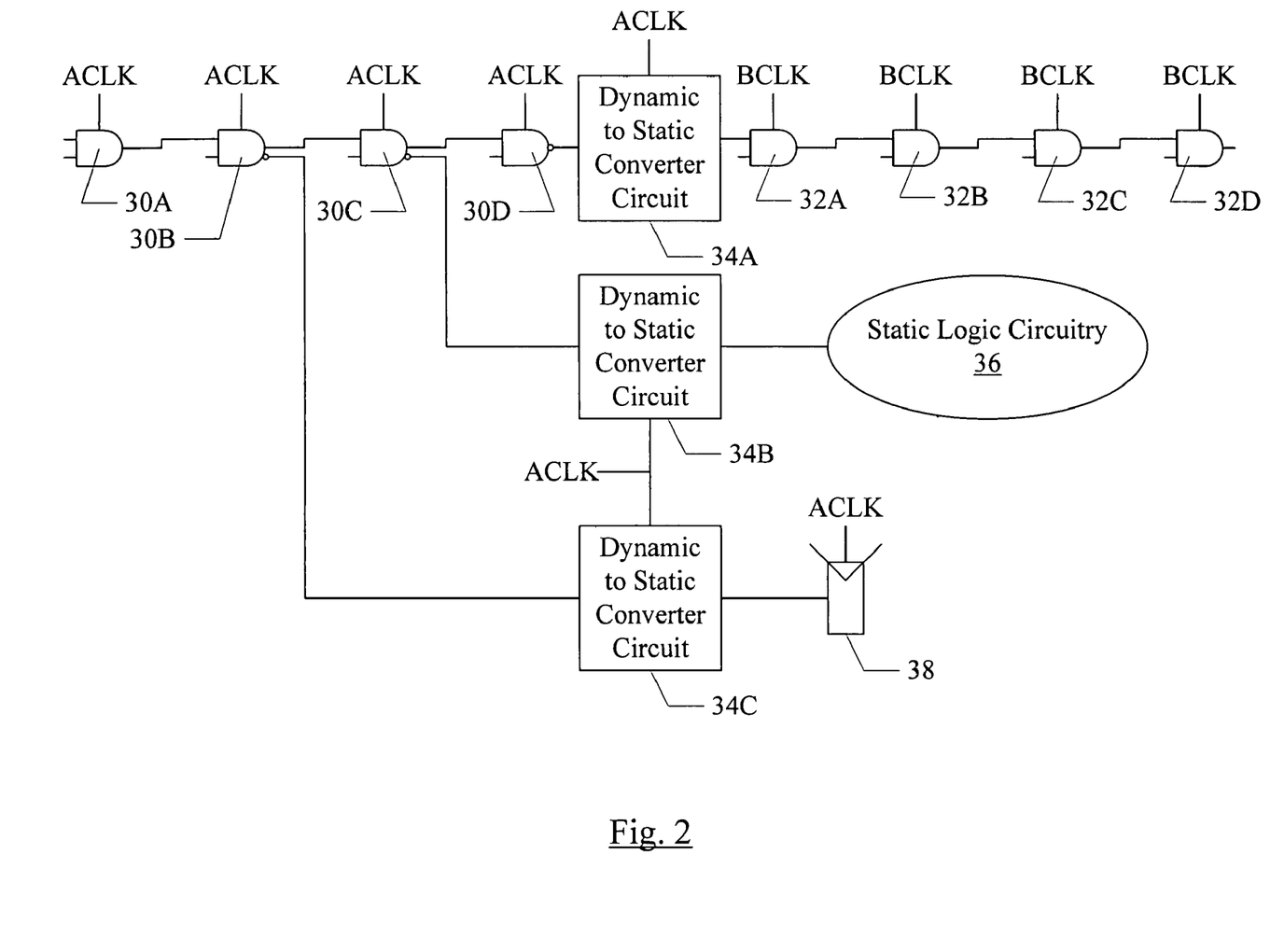
FIG. 2 is a circuit diagram of one embodiment of dynamic circuitry and dynamic to static conversion circuits.

Turning now to FIG. 2, a circuit diagram illustrating one embodiment of dynamic circuitry, dynamic to static converter circuits, static logic circuitry, and a static storage device is shown. Other embodiments are possible and contemplated. More particularly, the embodiment of FIG. 2 includes a set of A-phase dynamic logic circuits 30A–30D, a set of B-phase dynamic logic circuits 32A–32D, dynamic to static converter circuits 34A–34C, static logic circuitry 36, and a static storage device 38. It is noted that, while the symbols shown on FIG. 2 for the dynamic logic circuits 30A–30D and 32A–32D resemble AND gates or NAND gates, the symbols are intended, in this context, to represent any dynamic logic circuits performing any logic function. Each dynamic logic circuit 30A–30D and 32A–32D may receive one or more inputs and generate one or more outputs in response to the inputs. Each of the dynamic logic circuits 30A–30D is coupled to receive an ACLK clock signal and has outputs coupled to inputs as shown in FIG. 2. Additionally, in FIG. 2, the dynamic logic gate 30B has an output coupled to the dynamic to static converter circuit 34C, which is further coupled to provide a corresponding static logic input to the storage device 38, which is also clocked by the ACLK clock signal. The dynamic logic gate 30C has an output coupled to the dynamic to static converter circuit 34B, which is further coupled to provide a corresponding static logic input to the static logic circuitry 36. The dynamic logic gate 30D has an output coupled to the dynamic to static converter circuit 34A, which is coupled to provide a corresponding static logic input to the dynamic logic circuit 32A. Each of the dynamic logic circuits 32A–32D is coupled to receive a BCLK clock signal and has outputs coupled to inputs as shown in FIG. 2. Each of the dynamic to static converter circuits 34A–34C is coupled to receive the ACLK clock signal in FIG. 2.

Generally, the A-phase dynamic logic circuits 30A–30D precharge during the precharge phase of the ACLK clock signal and evaluate during the evaluate phase of the ACLK clock signal. Similarly, the B-phase dynamic logic circuits 32A–32D precharge during the precharge phase of the BCLK clock signal and evaluate during the evaluate phase of the BCLK clock signal. In one embodiment, the precharge phase is the low phase of the corresponding clock signal and the evaluate phase is the high phase of the corresponding clock signal. This example will be used in the remainder of this discussion, although other embodiments may reverse which phases are the precharge and evaluate phases (with corresponding changes to the circuitry).

The ACLK and BCLK clock signals may be approximately 180° out of phase, so that the evaluate phase of the A-phase dynamic logic circuits 30A–30D occurs while the precharge phase of the B-phase dynamic logic circuits 32A–32D occurs (and vice versa). Thus, approximately a full clock cycle of evaluation may be provided from the input of the A-phase dynamic logic circuits 30A–30D to the output of the B-phase dynamic logic circuits 32A–32D. The number of logic circuits which may evaluate in series in a phase may vary based on the desired clock cycle time and the speed at which the logic circuits may evaluate (which may depend on the semiconductor fabrication technology, among other things).

As mentioned above, during the precharge phase of the clock signal, the outputs of each of the dynamic logic circuits precharges to a predetermined state, which may differ from the state generated during the preceding evaluate phase. Also as mentioned above, the precharge phase of the A-phase dynamic logic circuits 30A–30D occurs while the evaluate phase of the B-phase dynamic logic circuits 32A–32D is occurring. Thus, A-phase dynamic logic outputs that are input to B-phase dynamic logic circuits 32A–32D may precharge during evaluation of the B-phase dynamic logic circuits 32A–32D, which may not provide enough time for the B-phase dynamic logic circuits 32A–32D to evaluate correctly based on the A-phase inputs. Therefore, the dynamic to static converter circuit 34A may be used to hold the evaluate output during the precharge phase of ACLK, thus providing a steady input during the evaluate phase of the B-phase dynamic logic circuits 32A–32D.

In the case of the storage device 38, which may latch a value responsive to the rising edge of ACLK, for example, the precharging of the dynamic logic circuits may cause the storage device 38 to capture the precharge state rather than the evaluated state. The dynamic to static converter circuit 34C may isolate the input of the storage device 38 from the precharge, maintaining the state from the previous evaluate phase for storage.

Similarly, the static logic circuitry 36 may expect inputs to be stable until the end of the clock period, not only to the end of the evaluate phase. Accordingly, the dynamic to static converter circuit 34B converts the dynamic logic signal to a static logic signal for input to the static logic circuitry 36.

Generally, the dynamic to static converter circuits 34A–34C may convert the dynamic logic signals supplied as inputs thereto to corresponding static logic signals. Particularly, the dynamic to static converter circuits 34A–34C may prevent the precharge of the dynamic logic signals from changing the state of the corresponding static logic signals. Additionally, the dynamic to static converter circuits 34A–34C may include noise suppression circuits which, responsive to the precharge phase of the input clock signal ACLK, are configured to actively drive the static logic signals. Since the noise suppression circuits are activated during the precharge phase (and do not impede operation during the evaluate phase), the noise suppression circuits may be sized for the expected noise that may occur on the static logic signal (e.g. based on the length of the wire carrying the static logic signal to its destination, empirical or estimated noise in the surrounding circuitry, etc.). That is, the noise suppression circuits may be designed to strongly drive the static logic signals during the precharge phase, thus resisting the noise that may be injected on the static logic signals.

Since the dynamic to static converter circuits 34A–34C provide noise suppression, the output static logic signals may be routed relatively long distances on wires, without requiring shielding, in some embodiments. Thus, flexibility in placing the receiving circuits (e.g. the B-phase dynamic logic, the static logic circuitry 36, or the storage device 38) may be provided since these circuits needn't be near the dynamic to static converter circuits 34A–34C. Additionally, the complexities of adding shielding may be avoided or reduced, in some embodiments.

In the illustrated embodiment, the dynamic to static converter circuits are shown as receiving inverted outputs as compared to the outputs which are inputs to other dynamic logic circuits (e.g. dynamic logic circuits 30B–30D). The dynamic logic circuits may comprise an internal node which is precharged high and evaluates low and an output node which is the inverse of the internal node and is used to feed other dynamic logic circuits. In this embodiment, the dynamic to state converter circuits 34A–34C may operate from the internal node. Other embodiments may receive the same dynamic logic signal as the other dynamic circuits. More detail will be provided below in the discussion of FIG. 3.

It is noted that, while the dynamic to static converter circuits 34A–34C are shown as receiving the ACLK signal and A-phase dynamic logic signals, similar circuits may be receive the BCLK signal and B-phase dynamic logic signals for conversion to static logic signals. Thus, for the remainder of this discussion, a clock signal labeled "Clock" will be used. Either ACLK or BCLK may be the clock signal, as appropriate, or any other clock signal may be used.

Figure 3:
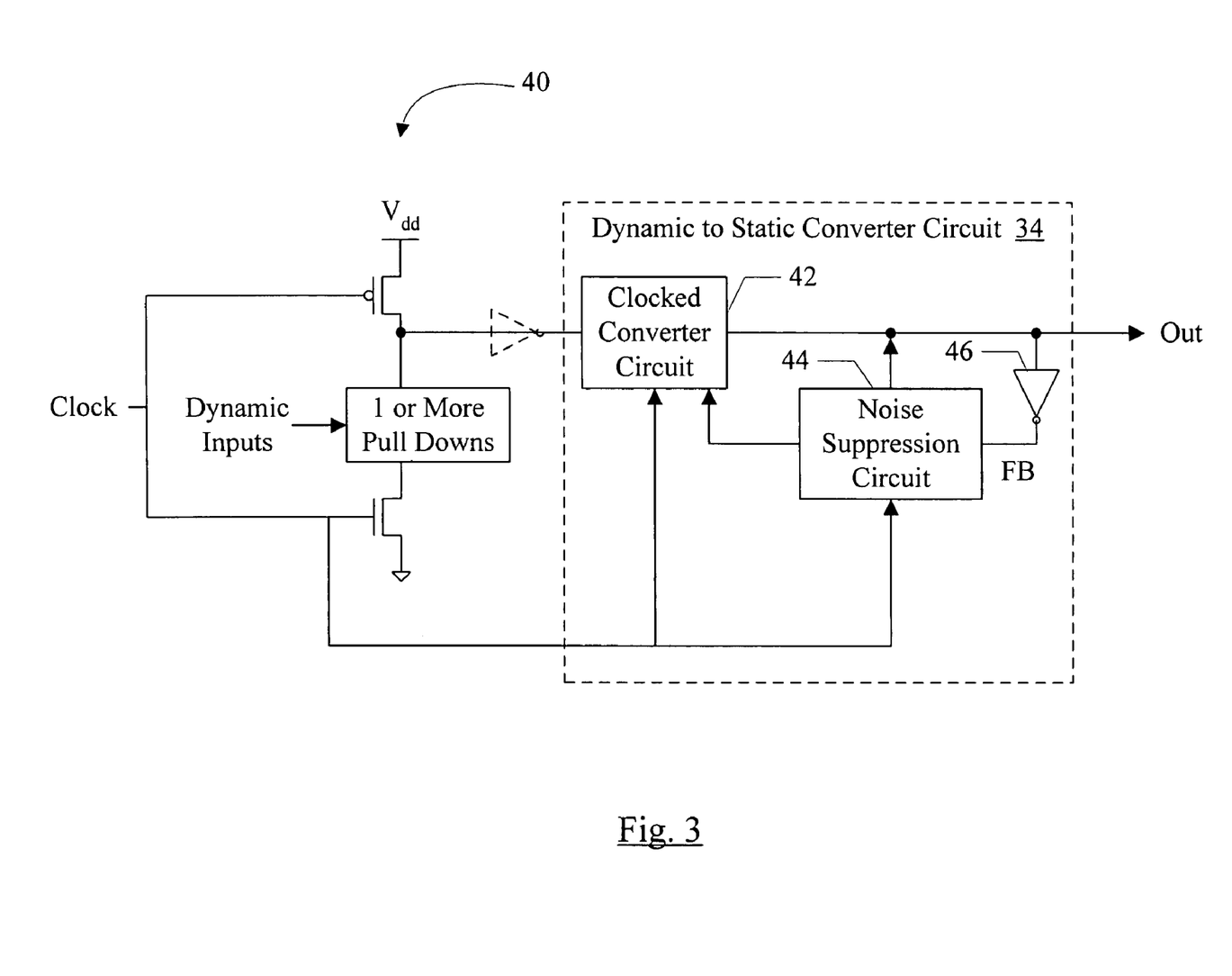
FIG. 3 is a circuit diagram of one embodiment of a dynamic to static converter circuit fed by a dynamic circuit.

Turning now to FIG. 3, a circuit diagram illustrating one embodiment of a dynamic logic circuit 40 and a dynamic to static converter circuit 34 is shown. Other embodiments are possible and contemplated. In the embodiment of FIG. 3, the dynamic to static converter circuit 34 includes a clocked converter circuit 42, a noise suppression circuit 44, and an inverter 46. The clocked converter circuit 42 is coupled to receive a dynamic logic signal from the dynamic logic circuit 40 and is coupled to receive the clock signal and an input from the noise suppression circuit 44. The clocked converter circuit 42 is coupled to the output node on which the output static logic signal ("Out") is provided. The noise suppression circuit 44 is coupled to receive the clock signal and a feedback signal ("FB") generated by the inverter 46 from the Out signal, and is coupled to the output node.

The dynamic logic circuit 40 is illustrative of one embodiment of a general dynamic logic circuit. Particularly, any of the dynamic logic circuits 30A–30D and 32A–32D may be configured similar to the dynamic logic circuit 40. The pull downs in the dynamic logic circuit 40 may be arranged in various series and parallel configurations to accomplish a desired logic function. In the illustrated embodiment, the clocked converter circuit 42 is coupled to the internal node (which is precharge high and conditionally evaluates low, in the illustrated embodiment). Other embodiments are contemplated in which one or more inverters may be included between the internal node and the clocked converter circuit 42 (illustrated in FIG. 3 with the dashed inverter between the internal node and the clocked converter circuit 42). The examples given below assume that the clocked converter circuit 42 is coupled to the internal node or an even number of inverters are included between the internal node and the clocked converter circuit 42. Complementary clocked converter circuits to those shown may be used if an odd number of inverters is included between the internal node and the clocked converter circuit 42, or the clocked converter circuit 42 may include an inverter on the input.

The dynamic to static converter circuit 34 may be used wherever dynamic to static conversion is desired. For example, each of the dynamic to static converter circuits 34A–34C in FIG. 2 may be constructed using the dynamic to static converter circuit 34, in one embodiment.

Generally, the clocked converter circuit 42 receives the dynamic logic signal (also referred to below as a "dynamic data input" or "DDI") and converts the dynamic logic signal to a static logic signal. Particularly, in the illustrated embodiment, the clocked converter circuit 42 receives the clock signal and, during the precharge phase of the clock signal, isolates the output node from changes in the dynamic logic signal. That is, when the dynamic logic signal changes state due to the precharge, the Out signal does not change state.

The noise suppression circuit 44 actively drives the output node during the precharge phase, responsive to the clock signal. The noise suppression circuit actively resists changes in the Out signal that might be caused by noise injected on the wires carrying the Out signal during the precharge phase. During the evaluate phase, the noise suppression circuit 44 operates in such a way as to not impede the operation of the clocked converter circuit 42, thus allowing the clocked converter circuit 42 to drive the output node with a signal corresponding to the value of the dynamic logic signal evaluating during the current evaluation phase.

In the illustrated embodiment, the noise suppression circuit 44 receives the FB signal (the inverse of the Out signal) and drives the output node further responsive to the FB signal. The FB signal informs the noise suppression circuit 44 of the value of the Out signal, and thus the value to actively drive on the output node. In other embodiments, the noise suppression circuit may determine the value to drive on the output node by other means.

Figure 4:
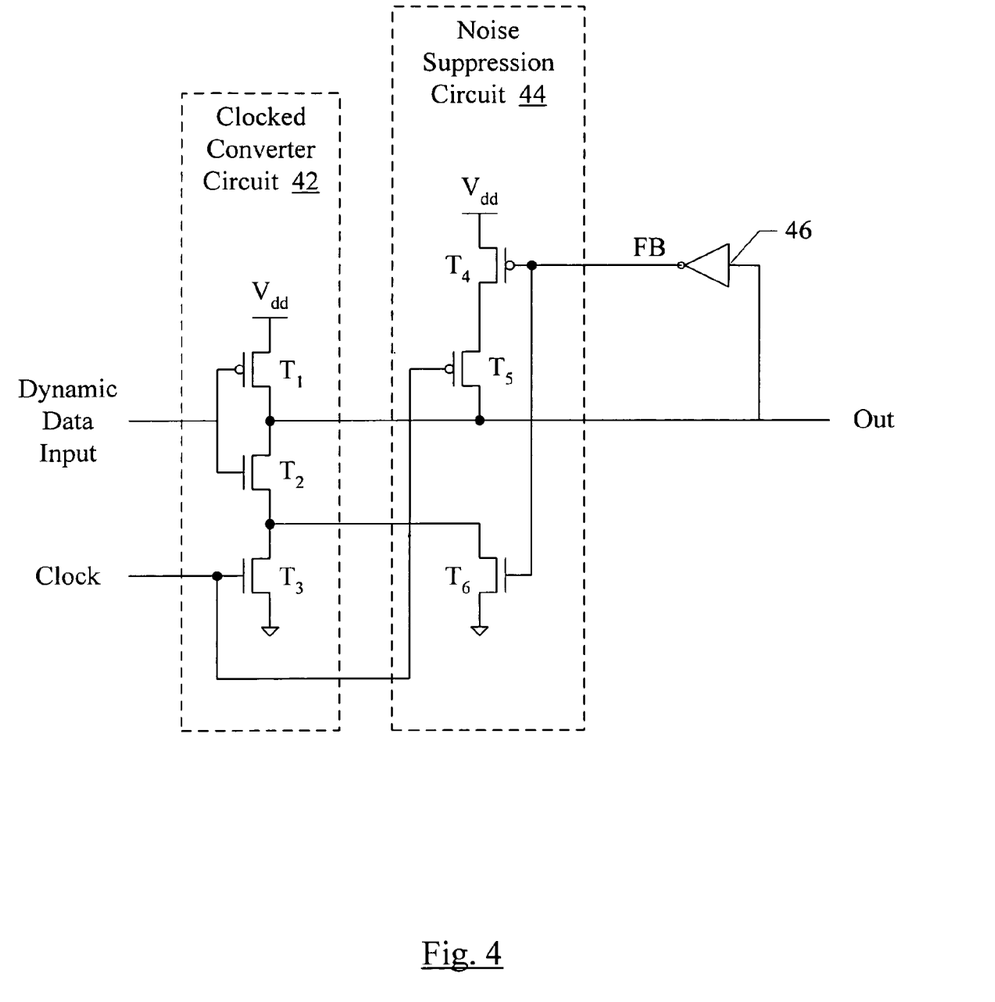
FIG. 4 is a circuit diagram of one embodiment of a clocked converter circuit and one embodiment of a noise suppression circuit.

In the illustrated embodiment, the noise suppression circuit 44 supplies an input to the clocked converter circuit 42. More particularly, in this embodiment, the noise suppression circuit 44 may utilize one or more transistors in the clocked converter circuit 42 for actively driving the output node. An example is shown in FIG. 4. In other embodiments, the noise suppression circuit 44 may not provide an input to the clocked converter circuit 42 (see, e.g., the embodiments of FIG. 7).

Figure 5:
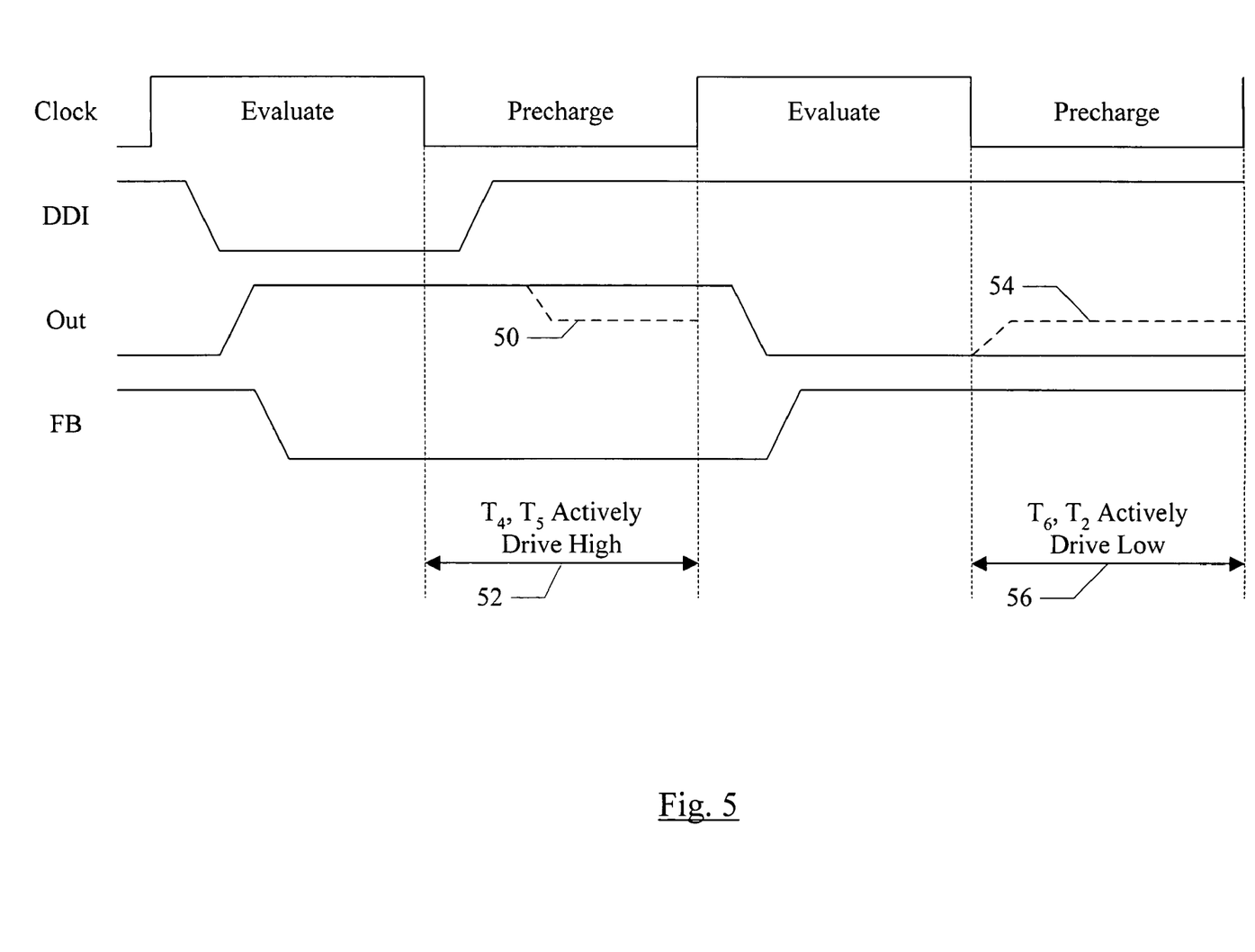
FIG. 5 is a timing diagram illustrating operation of the circuit diagram shown in FIG. 4.

Turning next to FIG. 4, a circuit diagram illustrating one embodiment of the clocked converter circuit 42 and the noise suppression circuit 44 is shown. Other embodiments are possible and contemplated. In the embodiment of FIG. 4, the clocked converter circuit 42 includes three transistors (T1, T2, and T3). T1 is a p-type metal-oxide-semiconductor (PMOS) transistor and T2 and T3 are each an n-type metal-oxide-semiconductor (NMOS) transistor. T1 has a source node coupled to the power supply ($V_{dd}$), a drain node connected to the output node, and a gate node coupled to receive the dynamic data input (DDI) from the dynamic logic circuit 40, for example. T2 has a drain node connected to the output node, a source node connected to the drain node of T3 (that is, T2 and T3 are connected in series), and a gate node coupled to receive the DDI. T3 has a source node coupled to ground and a gate node coupled to receive the clock signal. The noise suppression circuit 44 includes three transistors T4, T5, and T6. T4 and T5 are PMOS transistors and T6 is an NMOS transistor. T4 has a source node coupled to $V_{dd}$, a drain node connected to the source node of T5 (that is, T4 and T5 are connected in series), and a gate node coupled to receive the FB signal. T5 has a drain node connected to the output node and a gate node coupled to receive the clock signal. T6 has a source node coupled to ground, a gate node coupled to receive the FB signal, and a drain node connected to the source node of T2 in the clocked converter circuit. FIG. 5 is a timing diagram corresponding to the circuitry shown in FIG. 4. The timing diagram illustrates two periods of the clock signal, with the high phase being the evaluate phase and the low phase being the precharge phase for this embodiment. In the first period of the clock signal, exemplary operation is shown when the DDI evaluates low. In the second period of the clock signal, exemplary operation is shown when the DDI evaluates high. The Out signal and FB signal are also shown in FIG. 5.

For the embodiment of FIG. 4, the dynamic data input precharges high and conditionally evaluates low and the evaluate phase is the high phase of the clock. Thus, during the evaluate phase, T3 is active (or "on"). Therefore, during the evaluate phase, T1 and T2 operate as an inverter, driving the inverse of the DDI on the output node. The Out signal thus reflects the evaluated value of the DDI input (it is the inverse of the DDI input). During the precharge phase (clock low), T3 deactivates (or turns "off"). During the precharge phase, the DDI is precharged to a high value. T2 is active and T1 is not active due to the precharged DDI. Since T3 is inactive, activated T2 does not cause the state of the output signal to change. In other words, T3 isolates the output node from the effects of the precharge. Thus, the output node may be a static logic signal.

Since T1 and T3 are inactive once the DDI input is precharged during the precharge phase, the clocked converter circuit 42 is not actively driving the output node. The noise suppression circuit 44 actively drives the output node during the precharge phase, thus reducing the noise sensitivity of the Out signal.

Particularly, if the Out signal is high (corresponding to an evaluation of low on the DDI during the preceding evaluate phase), the FB signal is low. Therefore, T4 is active. Additionally, T5 is active during the precharge phase. Thus, the combination of T4 and T5 actively drive the output signal high during the precharge phase. In response to the clock signal transitioning to the evaluate phase, T5 deactivates and thus the Out signal may be driven by the clocked converter circuit 42 without being impeded by the T4–T5 combination.

The operation described in the preceding paragraph is illustrated during the first period of the clock signal shown in FIG. 5. At the beginning of the evaluate phase, the DDI is high (from the preceding precharge) and thus the Out signal is low and the FB signal is high. During the evaluate phase, the DDI goes low. T1 pulls the Out signal high, and the inverter 46 drives the FB signal low. The clock signal then transitions to the precharge phase, deactivating T3. The DDI signal precharges high. In the absence of the noise suppression circuit 44, the Out signal would be tristated once the DDI signal precharges high (as illustrated by the dashed line 50 on the Out signal in the precharge phase of the first clock period in FIG. 5). However, since T4 and T5 are active in response to the low clock signal and the low FB signal, T4 and T5 actively drive the Out signal high during the precharge phase (arrow 52).

On the other hand, if the DDI evaluates high during the evaluate phase (e.g. the DDI is not driven low during the evaluate phase), the Out signal is low during the evaluate phase. Thus, the FB signal is high and T6 is active. T6 remains active during the precharge phase. Additionally, since the DDI signal evaluates high (the same as the precharge value), T2 is active. The combination of T2 and T6 (which is connected to the source node of T2) actively drives the Out signal low during the precharge phase. In this embodiment, T6 may remain active in parallel with T3 activating during the subsequent evaluate phase. However, if the DDI input evaluates low, the T2 transistor deactivates and allows the T1 transistor to pull the Out signal high. Thus, the T6 transistor does not impede the operation of the clocked converter circuit 42 in transitioning the Out signal high during the evaluate phase.

The operation described in the preceding paragraph is illustrated in FIG. 5 in the second period of the clock signal. During the evaluate phase, the DDI remains high. Since the T3 transistor has been activated during the evaluate phase, the Out signal is driven low through the combination of T2 and T3. The FB signal transitions high in response. The clock transitions to the precharge phase, thus deactivating T3. In the absence of the noise suppression circuit, the Out signal would be tristated during the precharge phase (illustrated as the dotted line 54 on the output signal). However, since T6 is active due to the high FB signal and T2 is active due to the high DDI signal, the combination of T2 and T6 actively drive the Out signal low during the precharge phase (arrow 56).

Generally, the transistors shown in FIG. 4 may have any sizing desired. Typically, the T1–T3 transistors may be sized based on the expected load of the Out signal. The T4–T6 transistors, since they do not impede the transition of the evaluate transistors, may be sized relatively freely as compared to the T1–T3 transistors. For example, the T4–T6 transistors may be sized the same as, or even larger than, the T1–T3 transistors. Generally, the T4–T6 transistors may be sized based on the expected noise that may be experienced on the Out signal. In some embodiments, the T4–T6 transistors may be sized smaller than the T1–T3 transistors, since resisting noise may not require as much drive capability as driving the expected load. For example, the transistors T4–T6 may be sized in a range of about 30% to about 50% of the size of the transistors T1–T3. In one particular embodiment, the T4–T6 transistors may be sized about 30% of the T1–T3 transistors. Any ratio of sizes may be used in various embodiments.

Generally, the "size" of a transistor may refer to its capability to provide current through its nodes (e.g. source and drain nodes) when active. For CMOS transistors, if all transistors have the same channel length, relative sizes of transistors may be determined from the channel widths. In some cases, the channel length may vary from transistor to transistor and thus the channel length and channel width may be factors in the relative size.

The embodiment of FIG. 4 employs a relatively small number of transistors, which may, in some embodiments, simplify implementation due to a small area occupied by the circuitry and may, in some embodiments, have a relatively low power consumption due to the small number of transistors used.

It is noted that, in some embodiments, a weak inverter may have an input coupled to receive the FB signal and having an output coupled to the Out signal. The inverter may be weak in comparison, e.g., to the inverter 46 in FIG. 4.

In the embodiment of FIG. 4, the clocked converter circuit 42 is coupled to receive one dynamic logic signal and inverts the dynamic logic signal. However, other embodiments are contemplated in which multiple dynamic logic signals are received and the clocked converter circuit 42 computes a logic function on the dynamic logic signals in addition to the conversion. For example, FIG. 6 is a circuit diagram illustrating two additional embodiments of the clocked converter circuit 42 (labeled clock converter circuit 42a and clocked converter circuit 42b in FIG. 6).

The clocked converter circuit 42a performs a NAND function on two dynamic logic signals DDI1 and DDI2. The transistors T1, T2, and T3 are provided similar to the embodiment shown in FIG. 4. Additionally, a transistor T8 is connected in series with the transistors T2 and T3 (and has a gate node coupled to receive the DDI2 signal) and a transistor T9 is connected in parallel with the transistor T1 (and has a gate node coupled to receive the DDI2 signal). During the evaluate phase (T3 active), the transistors T1, T2, T8, and T9 operate as a NAND gate. During the precharge phase, the transistor T3 deactivates and thus prevents the precharge of DDI1 and DDI2 from changing the state of the Out signal. For the embodiment shown, the transistor T6 of the noise suppression circuit 44 may have its drain node connected to either the source node of the transistor T8 or the source node of transistor T2. Other embodiments similar to the clocked converter circuit 42a may provide a NAND function with larger numbers of inputs.

The clocked converter circuit 42b performs a NOR function on two dynamic logic signals DDI1 and DDI2. The transistors T1–T3 are provided similar to the embodiment of FIG. 4. Additionally, a transistors T11 is connected in parallel with the T2 transistor. The gate node of the transistor T11 is coupled to receive the DDI2 signal. A transistor T10 is connected in series with the T1 transistor, and has a gate node coupled to receive the DDI2 signal. During the evaluate phase (T3 active), the transistors T1, T2, T10, and T11 operate as a NOR gate. During the precharge phase, the transistor T3 deactivates and thus prevents the precharge of the DDI1 and DDI2 signals from affecting the Out signal. In this embodiment, the transistor T6 of the noise suppression circuit 44 may have its drain node connected to the source nodes of the transistors T2 and T11. Other embodiments similar to the clocked converter circuit 42b may provide a NOR function with larger numbers of inputs.

Figure 6:
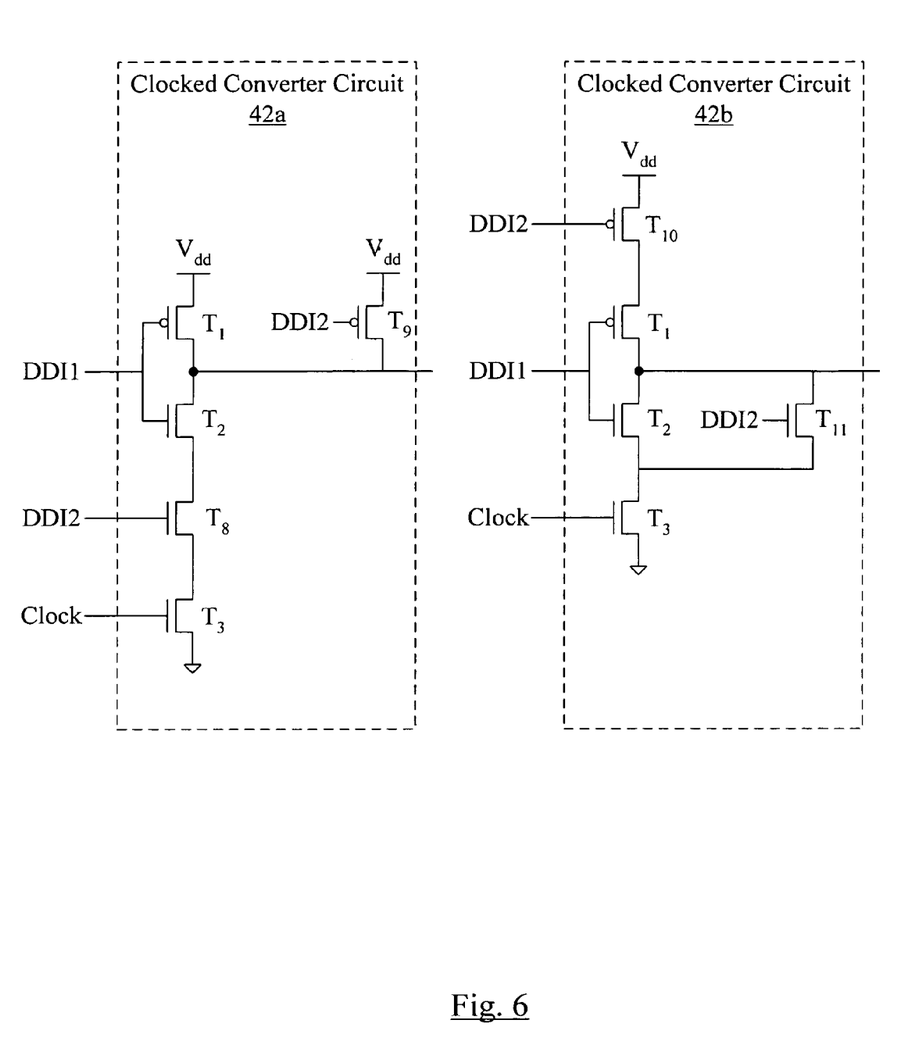
FIG. 6 is a circuit diagram illustrating additional embodiments of the clocked converter circuit.

While the embodiments shown in FIG. 6 provide NAND and NOR functions, other embodiments are contemplated in which any logical function may be provided through appropriate combinations of series and parallel connections of transistors.

Other embodiments of the noise suppression circuit 44 are also contemplated. For example, FIG. 7 is a circuit diagram illustrating two additional embodiments of the noise suppression circuit 44 (noise suppression circuit 44a and noise suppression circuit 44b).

The noise suppression circuit 44a employs an inverter 60 coupled to receive the FB signal as an input and the output of which is gated by a passgate 62. The passgate 62 is coupled between the inverter 60 and the output node, and is coupled to the clock signal to be open during the precharge phase of the clock (clock low in this embodiment) and closed during the evaluate phase of the clock. Since the inverter 60 is isolated from the output node during the evaluate phase, the inverter may be sized to provide noise suppression similar to the above discussion of the embodiment of FIG. 4.

The noise suppression circuit 44b comprises a tristate inverter 64 coupled to receive the FB signal as an input and having its output connected to the output node. The tristate inverter is controlled by the clock signal such that the tristate inverter 64 is driving during the precharge phase and is tristated during the evaluate phase. Since the tristate inverter 64 is isolated from the output node during the evaluate phase, the inverter 64 may be sized to provide noise suppression similar to the above discussion of the embodiment of FIG. 4.

Figure 7:
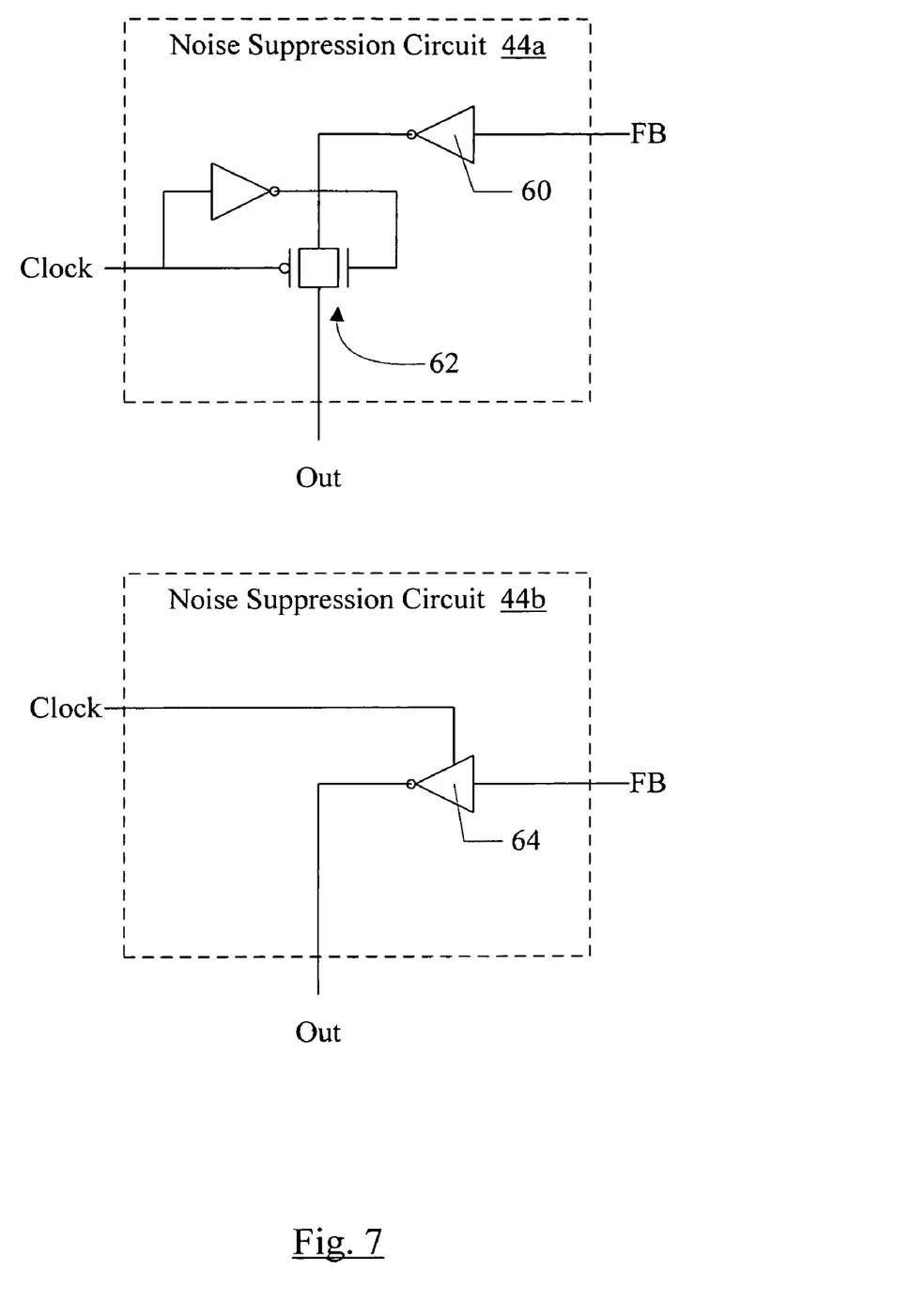
FIG. 7 is a circuit diagram illustrating additional embodiments of the noise suppression circuit.

It is noted that the embodiments shown in FIG. 7 do not include supplying an input to the clocked converter circuit 42. Thus, as mentioned above, the input from the noise suppression circuit 44 to the clocked converter circuit 42 is optional and may be used or not used in various embodiments.

Figure 8:
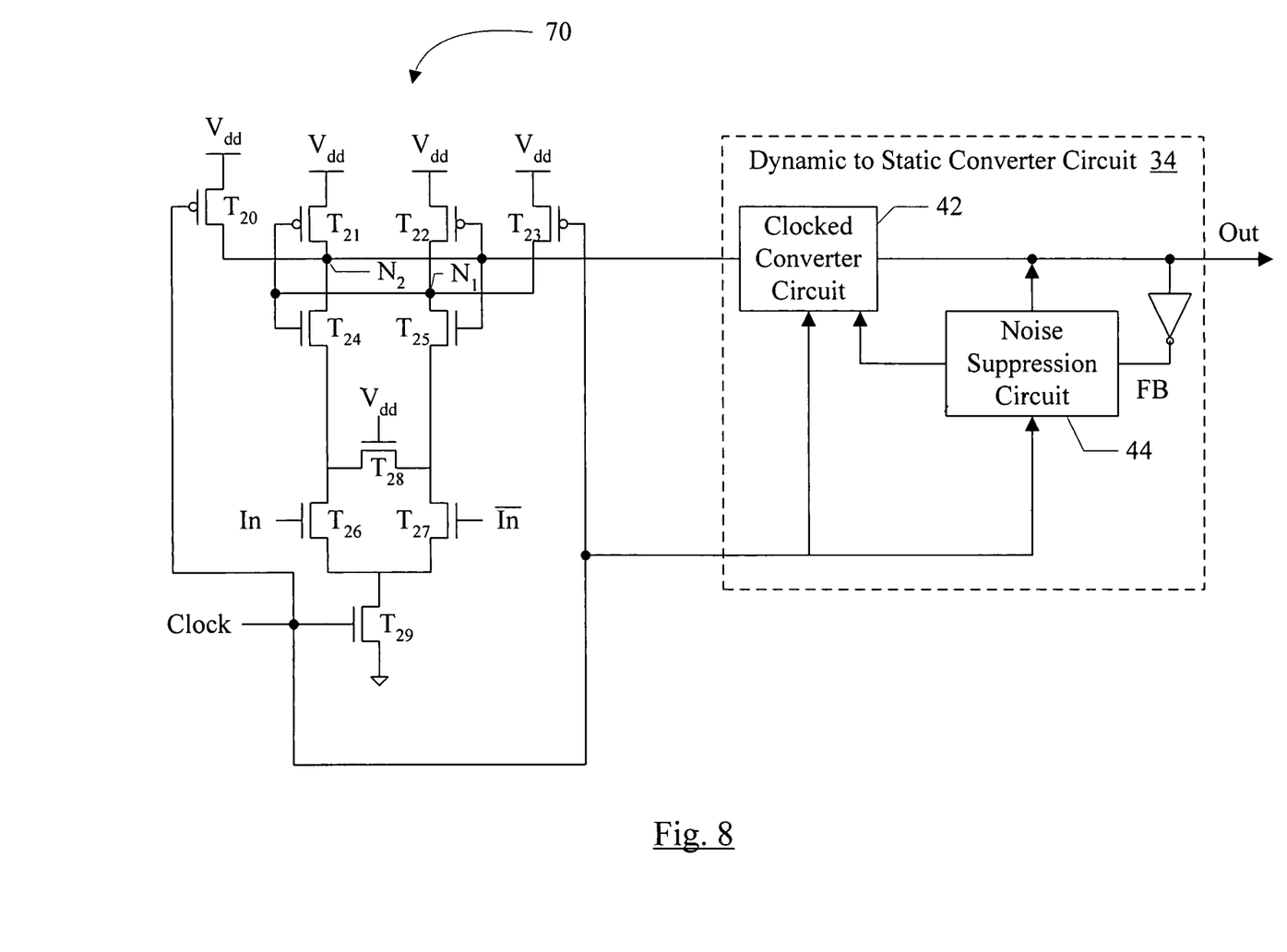
FIG. 8 is a circuit diagram of one embodiment of a dynamic flop circuit and one embodiment of the dynamic to static converter circuit.

Turning next to FIG. 8, a block diagram of a dynamic flop circuit 70 which may use the dynamic to static converter circuit 34 is shown. Other embodiments are possible and contemplated.

The transistors T21, T22, T24, and T25 form cross-coupled inverters than can be used as a memory cell. During the precharge phase of the clock, the transistors T20 and T23 precharge the input and output nodes of the inverters to a high voltage. During the evaluate phase of the clock, the transistor T29 activates. The input signal (In) and its complement (In with a bar over it) are coupled to the transistors T26 and T27. Operation for In being a one (and thus In with a bar over it being a zero) will be described first. Transistor 26 is active, and transistor T27 is inactive. Therefore, the node N1 begins discharging through T26 (active due to the In signal being a one), T28 (which is always active) and T25 (active due to the precharge). The node N2 (which is also the output node) begins discharging through T26 and T24 (active due to the precharge). Since node N2 is being discharged through two transistors while N1 is being discharged through three transistors, N2 is discharged more rapidly (which also causes T25 to deactivate and T22 to activate) and thus the node N1 finishes at a high voltage and the node N2 finishes at a low voltage. The output to the dynamic to static converter circuit 34 is a zero. Similar operation occurs if In is a zero, except that T27 is active instead of T26 and N1 finishes at a low voltage, and the node N2 finishes at a high voltage. The output to the dynamic to static converter circuit is a one.

It is noted that the precharge phase and the evaluate phase have been described above as being phases of the clock signal. However, it is contemplated that the precharge phase and the evaluate phase may be derived from the phases of the clock signal. The precharge phase may be shorter or longer than the corresponding clock phase, as may the evaluate phase, as desired. Thus, precharge of the dynamic logic circuits may be responsive to a clock phase, and evaluate may be responsive to a clock phase.

It is noted that, while CMOS transistors (PMOS and NMOS) have been used as an example herein, generally a transistor may be any device having at least a first node and a second node, where conduction between the first node and the second node is controlled via a control node. A transistor is active, or on, if it is conducting and is inactive, off, or deactivated if it is not conducting.

Figure 9:
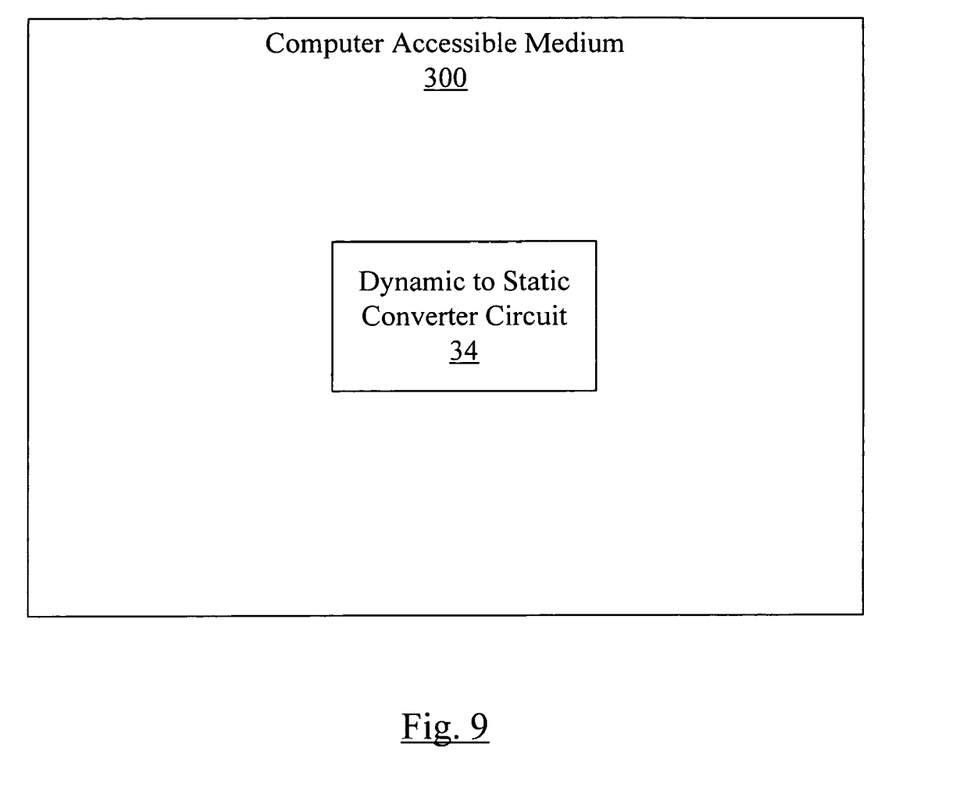
FIG. 9 is a block diagram of one embodiment of a computer accessible medium.

Turning next to FIG. 9, a block diagram of a computer accessible medium 300 including one or more data structures representative of the dynamic to static converter circuit 34 is shown. Generally speaking, a computer accessible medium may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Generally, the data structure(s) of the circuitry carried on the computer accessible medium 300 may be read by a program and used, directly or indirectly, to fabricate the hardware comprising the circuitry. For example, the data structure(s) may include one or more behavioral-level descriptions or register-transfer level (RTL) descriptions of the hardware functionality in a high level design language (HDL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium 300 may be the netlist(s) (with or without the synthesis library) or the data set(s), as desired. In yet another alternative, the data structures may comprise the output of a schematic program, or netlist(s) or data set(s) derived therefrom.

While computer accessible medium 300 carries a representation of the dynamic to static converter circuit 34, other embodiments may carry a representation of any portion of the dynamic to static converter circuit 34 (e.g. the clocked converter circuit 42, 42a, and/or 42b, the noise suppression circuit 44, 44a, and/or 44b, the inverter 46) and/or additional circuitry (e.g. the dynamic logic circuits 30A–30D and 32A–32D, the static logic circuitry 36, the storage device 34, the dynamic logic circuit 40, the flop 70, etc.).

Numerous variations and modifications will become apparent to those skilled in the art once the above disclosure is fully appreciated. It is intended that the following claims be interpreted to embrace all such variations and modifications.

What is claimed is:

1. An apparatus comprising:
a converter circuit coupled to receive a plurality of dynamic logic input signals, in which the converter circuit has a plurality of input transitors gated by the plurality of dynamic logic input signals, including a first pair of complementary metal-oxide-semiconductor (CMOS) transistors coupled to be grated by a first of the dynamic logic input signals, to generate a logical combination of the plurality of dynamic logic input signals as a static logic output signal on an output node during an evaluate phase of a clock signal, the static logic output signal having a first state or a second state depending on the dynamic logic input signals, the converter circuit further including a first clocked transistor to be active to enable the first pair of CMOS transistors during the evaluate phase, but to float the output node to retain the state of the static logic output signal during a precharge phase of the clock signal when a precharge voltage is to be applied to gate inputs of the first pair of CMOS transisitors; and a noise suppression circuit, including a second pair of CMOS transistors coupled to be gated by a feedback voltage from the output node, to sustain the state of the output node during the precharge phase, the noise suppression circuit further including a second clocked transistor which is to be active during the precharge phase to couple a first potential onto the output node through the second clocked transistor and one of the second pair of CMOS transistors when the output node is in the first state, but to couple a second potential through the other of the second pair of CMOS transistors and one of the first pair of CMOS transistors of the converted circuit when the output node is in the second state.

2. The apparatus as recited in claim 1 wherein the first clocked transistor is a NMOS transistor and the second clocked transistor is a PMOS transistor.

3. The apparatus as recited in claim 1 wherein the first potential placed on the output node is coupled from a supply voltage and the second potential placed on the output node is coupled from ground.

4. The apparatus as recited in claim 3 wherein the converter circuit operates as an inverter.

5. The apparatus as recited in claim 4 wherein the feedback voltage is an inverted state of the static logic output signal.

6. The apparatus as recited in claim 1 wherein the transistors of the noise suppression circuit are sized between approximately 30%–50% of the transistors in the converter circuit.

7. The apparatus as recited in claim 1 wherein the transistors of the noise suppression circuit are sized approximately 30% of the transistors in the converter circuit.

8. The apparatus as recited in claim 1 wherein the transistors of the converter circuit and the noise suppression circuit are sized according to an expected noise on the output node.

9. A circuit comprising:
a converter circuit coupled to receive a plurality of dynamic logic signals, in which the converter has a plurality of input transistors gated by the plurality of dynamic logic input signals, the converter circuit having a first pair of complementary metal-oxide-semiconductor (CMOS) transistors and a first clocked transistor coupled in series between a supply voltage node and a supply return node and in which an output node is obtained at a junction of the first pair of CMOS transistors, the first pair of CMOS transistors coupled to be gated by a first of the dynamic logic input signals to generate a logical combination of the plurality of dynamic logic input signals as a static logic output signal onto the output node during an evaluate phase of a clock signal when the clock signal activates the first clocked transistor to enable the converter circuit, but during a precharge phase of the clock signal when a precharge voltage is to be applied to gate inputs of the first pair of CMOS transistors, the first clocked transistor is deactivated to float the output node to retain existing state of the static logic output signal; and a noise suppression circuit having a second pair of CMOS transistors and a second clocked transistor, in which one of the second pair of CMOS transistors and the second clocked transistor are coupled in series between the supply voltage node and the output node and other of the second pair of CMOS transistors and one of the transistors of the first pair of CMOS transistors of the converter circuit are coupled in series between the output node and the supply return node, the second pair of CMOS transistors gated by a feedback voltage from the output node to either place a supply voltage potential from the supply voltage node or supply return potential from the supply return node onto the output node during the precharge phase to maintain the state of the logic output signal to suppress noise on the output node.

10. The circuit as recited in claim 9 wherein the first clocked transistor is a NMOS transistor and the second clocked transistor is a PMOS transistor.

11. The circuit as recited in claim 10 wherein the one of the second pair of CMOS transistors and the second clocked transistor coupled between the supply voltage node and the output node are PMOS transistors and wherein the other of the second pair of CMOS transistors and one of the transistors of the first pair of CMOS transistors coupled between the output node and the supply return node are NMOS transistors.

12. The circuit as recited in claim 11 wherein the transistors of the noise suppression circuit are sized between approximately 30%–50% of the transistors in the converter circuit.

13. The circuit as recited in claim 11 wherein the transistors of the noise suppression circuit are sized approximately 30% of the transistors in the converter circuit.

* * * * *

UNITED STATES PATENT AND TRADEMARK OFFICE
CERTIFICATE OF CORRECTION

PATENT NO. : 6,989,691 B2  Page 1 of 1
APPLICATION NO. : 10/748639
DATED : January 24, 2006
INVENTOR(S) : Brian Campbell It is certified that error appears in the above-identified patent and that said Letters Patent is hereby corrected as shown below:

Column 12, line 13, in Claim 1: replace "converted" with --converter--.

Signed and Sealed this

Second Day of December, 2008

JON W. DUDAS
*Director of the United States Patent and Trademark Office*